United States Patent [19]

Takabayashi

[11] Patent Number: 5,112,647
[45] Date of Patent: May 12, 1992

[54] APPARATUS FOR THE PREPARATION OF A FUNCTIONAL DEPOSITED FILM BY MEANS OF PHOTOCHEMICAL VAPOR DEPOSITION PROCESS

[75] Inventor: Akiharu Takabayashi, Yokohama, Japan

[73] Assignee: Canon Kabushiki Kaisha, Tokyo, Japan

[21] Appl. No.: 481,690

[22] Filed: Feb. 20, 1990

Related U.S. Application Data

[62] Division of Ser. No. 124,626, Nov. 24, 1987, abandoned.

[30] Foreign Application Priority Data

Nov. 27, 1986 [JP] Japan ............................ 61-280671

[51] Int. Cl.$^5$ .................................................. B05D 3/06
[52] U.S. Cl. ................................. 427/53.1; 427/54.1; 427/55
[58] Field of Search ............... 118/715, 722; 427/53.1, 427/55, 54.1, 56.1

[56] References Cited

U.S. PATENT DOCUMENTS

| | | | |
|---|---|---|---|
| 4,558,660 | 12/1985 | Nishizawa | 118/725 |
| 4,581,249 | 4/1986 | Kamiya | 427/53.1 |
| 4,626,449 | 12/1986 | Hirai | 427/53.1 |
| 4,699,863 | 10/1987 | Sawatari | 430/97 |
| 4,828,874 | 5/1989 | Hiraoka et al. | 427/53.1 |

FOREIGN PATENT DOCUMENTS

| | | | |
|---|---|---|---|
| 58-153324 | 9/1983 | Japan | 118/620 |
| 59-3931 | 1/1984 | Japan | . |
| 59-82732 | 5/1984 | Japan | 427/53.1 |
| 59-140368 | 8/1984 | Japan | 118/620 |
| 60-167334 | 8/1985 | Japan | 427/54.1 |
| 60-225434 | 11/1985 | Japan | 118/723 |
| 61-30028 | 2/1986 | Japan | 427/53.1 |

OTHER PUBLICATIONS

West, J. Vac Sci Technology A, 3(6), Nov./Dec. 1985, pp. 2278-2282.
Hanabusa, Appl. Phys. Lett. 35(8), Oct. 15, 1979, pp. 626-627.
Webster's New Collegiate Dictionary, ©1973, G & C Merriam Co., Springfield, Mass., p. 664.

*Primary Examiner*—Marianne Padgett
*Attorney, Agent, or Firm*—Fitzpatrick, Cella, Harper & Scinto

[57] ABSTRACT

An improvement in the photochemical vapor deposition apparatus for the preparation of a functional deposited film on a substrate by exciting and decomposing, or polymerizing a raw material as by way of a photochemical reaction, which comprises a reaction chamber with a raw material gas introducing means and an exhaust means, a radiant light transmissive window and a means to supply a light energy through the light transmissive window to the raw material gas introduced into the reaction space of the reaction chamber. The improvement comprises providing the above apparatus with a means to irradiate an infrared energy ray containing a wavelength having a vibrational absorption power for the raw material gas molecule concurrently with the irradiation of light energy.

The improved photochemical vapor deposition apparatus enables one to stably and repeatedly prepare a desired functional deposited film of high quality and having a wealth of practically applicable characteristics at an improved film deposition rate without foreign matter resulting from the raw material gas being deposited on the inner face of the light transmissive window.

4 Claims, 4 Drawing Sheets

5,112,647

APPARATUS FOR THE PREPARATION OF A FUNCTIONAL DEPOSITED FILM BY MEANS OF PHOTOCHEMICAL VAPOR DEPOSITION PROCESS

This application is a division of application Ser. No. 124,626 filed Nov. 24, 1987, now abandoned.

FIELD OF THE INVENTION

This invention relates to an apparatus for the preparation of a functional deposited film such as an amorphous silicon (hereinafter referred to as "A-Si") film by way of exciting, decomposing or polymerizing a starting gas at a low temperature utilizing a photochemical reaction. More particularly, it relates to an apparatus for the formation a functional deposited film by means of photochemical vapor deposition process being so structured that the film deposition rate can be improved by using together high energy light and infrared rays. The light transmissive window can be maintained free from the deposition of foreign matters.

BACKGROUND OF THE INVENTION

There are known a glow discharge process and a thermal induced chemical vapor deposition process as a method for the formation of a deposited film using a silicon hydride such as $SiH_4$ and $Si_2H_6$ as the starting material. These processes act a deposited film composed of A-Si is formed on a substrate by exciting and decomposing, or polymerizing such silicon hydride by the action of an electrical or thermal energy.

The thus formed deposited films are usable for various purposes.

However, in the case of forming a deposited film using the glow discharging process, it sometimes becomes difficult to establish the repeatable and stable film forming conditions because the resulting film will be influenced by a discharge energy during the film forming process particularly under a high power condition.

This problem will often occur in the case of forming a deposited film of large area or of greater thickness.

In the case of forming a deposited film by means of the thermal induced chemical vapor deposition process, limited kinds of substrates may be used because the deposition space must be maintained at a high temperature. In addition to this problem, it is difficult to obtain such a deposited film having the desired characteristics because the probability of bound, non-eliminated hydrogen atoms remaining in the resulting film composed of A-Si will decrease because of high temperature conditions.

In view of the above, there are still unsolved problems in the case of forming a deposited film by means of the glow discharge deposition process or the thermal induced chemical vapor deposition process, so that it is difficult to ensure uniform electrical and optical characteristics and the uniform quality of the resulting film. In addition to this, there are also other unsolved problems, such as in disorder or defects that occur at the surface of the resulting film or within the resulting film.

In order to solve the foregoing problems, there has been proposed a photochemical vapor deposition method using light energy (hereinafter referred to as "photo-CVD method") for the formation of a deposited film composed of A-Si.

In accordance with the photo-CVD method, there are advantages that a deposited film composed of A-Si can be formed through an ion-free chemical reaction at low temperature, and because of this, the foregoing problems can be greatly diminished.

Along with the photo-CVD method, there have been proposed various apparatuses for practicing said method. One such apparatus is of the kind that comprises a reaction chamber, raw material gas introducing means, means to supply light energy to a raw material gas in the deposition space of the reaction chamber and means to hold a substrate on which a deposited film is to be formed. A structure according to this method is shown in FIG. 4. Referring to FIG. 4, there are shown a luminous flux 1 of light energy supplied from a light source, light transmissive window 2, a deposited film 3, a substrate 4, deposition chamber 5, exhaust pipe 6 and raw material gas feed pipe 7.

However, for the foregoing apparatus, it is a problem that a A-Si material, which constitutes the resulting film on the substrate, is also deposited on the inner surface of the light transmissive window as foreign matter and this results in greatly reducing the strength of the incident light, thereby reducing deposition rate of a film to be formed on the substrate is reduced.

In order to solve this problem, it has been proposed that the inner face of the light transmissive window be coated with a vacuum pump oil. However, there are problems with or this proposed method, in that organic materials, including oily materials, often become dispersed in the deposition space of the deposition chamber during the film forming process. Such molecules are incorporated in a film to be formed. The resulting film is defective in quality and characteristics.

In order to solve the above problem, another proposal has been made that the inner face of the light transmissive window be periodically etched to thereby remove the foreign matter deposited thereon. Even for this method, there exist the problems that use of a raw material gas for the etching other than a film forming raw material gas is required because of this, the apparatus necessitates provision of an extra gas excitation apparatus to cause an etching reaction, such as an RF glow discharging apparatus. In view of this, the total scale of the apparatus in this case eventually becomes complicated, since the photo-CVD apparatus and the etching apparatus are combined.

SUMMARY OF THE INVENTION

This invention is aimed at eliminating the foregoing problems which are found on the conventional photo-CVD apparatus for the formation of a deposited film.

A main object of this invention is to provide an improved photo-CVD apparatus which makes it possible to effectively and repeatedly form a desired functional deposited film of a uniform thickness and homogeneous in quality.

Another object of this invention is to provide an improved photo-CVD apparatus which is so structured that the light transmissive window can be maintained so as to always exhibit its light transmitting function without deposition of foreign matters on its inner face. That makes it possible to effectively and repeatedly form a desired functional deposited film having a wealth of practically applicable characteristics.

The present inventor has conducted extensive studies in order to solve the problems in the aforementioned conventional photo-CVD apparatuses as shown in FIG. 4 and in order to attain the above objects.

That is, the present inventor has tried to irradiate a film forming raw material gas concurrently with a light energy and an infrared ray energy for the formation of a deposited film on a substrate by disposing a means to irradiate an said infrared ray energy in the deposition chamber of the aforementioned conventional photo-CVD apparatus.

As a result, the present inventor has found the following fact. That is, when as the infrared ray, there is used such infrared ray containing a wavelength having a vibrational absorption power for the film forming raw material molecule and which is of the intensity that slightly decomposes the film forming raw material gas, the film forming raw material gas effectively absorbs the irradiated infrared ray energy as supplied. The infrared ray absorbed raw material gas, that is, the raw material gas in the infrared path, effectively absorbs the light energy, even when it is of a low energy level, whereby the raw material gas is smoothly and effectively decomposed. That makes the film deposit onto the substrate remarkably well. When there is supplied a high light energy in the above case, the infrared ray absorbed raw material gas further effectively decomposes to thereby raise the film deposition rate.

The present inventor has also found that because the raw material gas is effectively decomposed and primarily used to form a deposited film, there is a slight chance for the inner face of the light transmissive window to be contaminated with deposited foreign matter.

In order to clarify the above situation, the present inventor has found the following facts.

That is, the interrelation between the internuclear distance of a raw material gas molecule (x) and the excitation energy (e) is conceptually as shown in FIG. 3. In order to directly photodissociate a general raw material gas, the electron excitation corresponding to the "a" shown in FIG. 3 is required. However, by vibrating the internuclear distance of the raw material gas molecule (x), that is, by subjecting it to vibrational excitation, it becomes possible to cause such electron excitation as shown by the mark "b" in FIG. 3.

That is, when the raw material gas molecule is vibrationally excited in advance, the raw material gas greatly absorbs light energy, even if it is of a low energy level, whereby the raw material gas is effectively and satisfactorily decomposed.

In view of the above, the raw material gas in the infrared ray path is easily decomposed with the action of light energy. Where the light energy is of a high energy level, said raw material gas is easily decomposed. Because of this, the formation of a deposited film on a substrate effectively proceeds at a high film deposition rate. On the other hand, because the raw material gas will be consumed mostly in forming the deposited film, there is a slight occasion for the inner face of the light transmissive window to be contaminated with the deposition of the foreign matter resulting from the raw material gas which occurs in the conventional photo-CVD apparatus.

This invention has been completed based on the above findings. Thus, this invention provides an improved photo-CVD apparatus for the formation of a functional deposited film on a substrate by exciting and decomposing, or polymerizing a raw material gas by way of a photochemical reaction which comprises a reaction chamber provided with a raw material gas introducing means and an exhaust means being provided, a light transmissive window and a means to supply irradiating light energy through the light transmissive window to the raw material gas introduced in the reaction space of the reaction chamber. There is also provided a means to irradiate the raw material gas with infrared ray energy containing a wavelength having a vibrational absorption power for the raw material gas molecule concurrently with the irradiation of light energy.

The photo-CVD apparatus thus structured according to this invention is satisfactorily free from the foregoing problems which are found on the aforesaid conventional photo-CVD apparatus and enables one to stably and repeatedly prepare a desired functional deposited film of a high quality and having a wealth of practically applicable characteristics, at an improved film deposition rate without the foreign matter resulting from the raw material gas being deposited on the inner face of the light transmissive window.

DESCRIPTION OF THE PREFERRED EMBODIMENTS

Representative embodiments of a photo-CVD apparatus for preparing a functional deposited film by way of the photochemical vapor deposition process according to this invention will now be explained in detail with reference to the drawings. The description is not intended to limit the scope of this invention.

Figure 1:
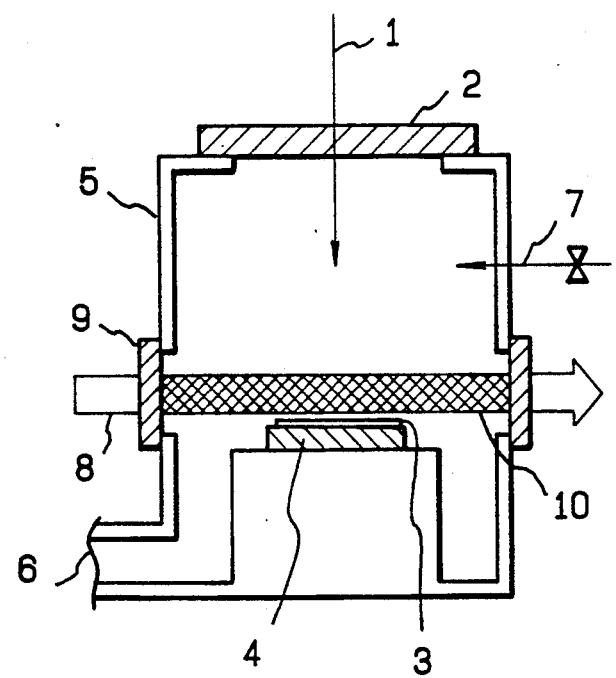
FIG. 1 and FIG. 2 are schematic diagrams of photochemical vapor deposition apparatuses for carrying out the process for preparing a functional deposited film by way of the photochemical vapor deposition process according to this invention.
Figure 2:
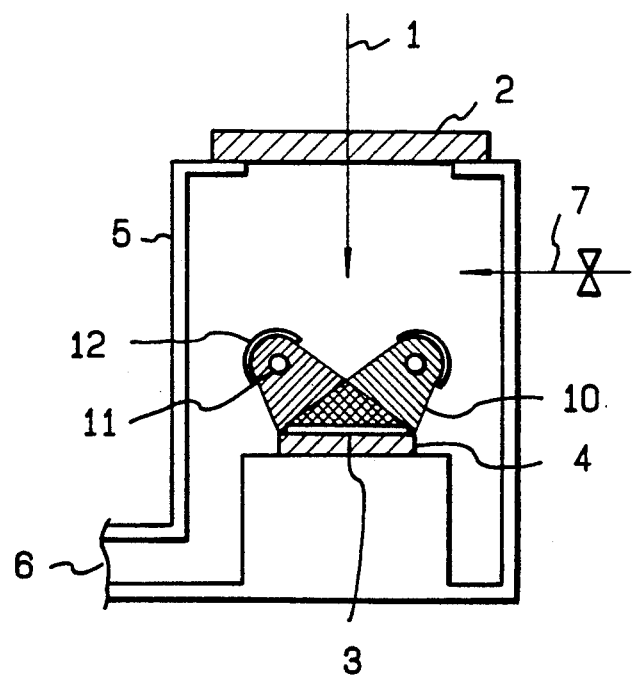
Figure 3:
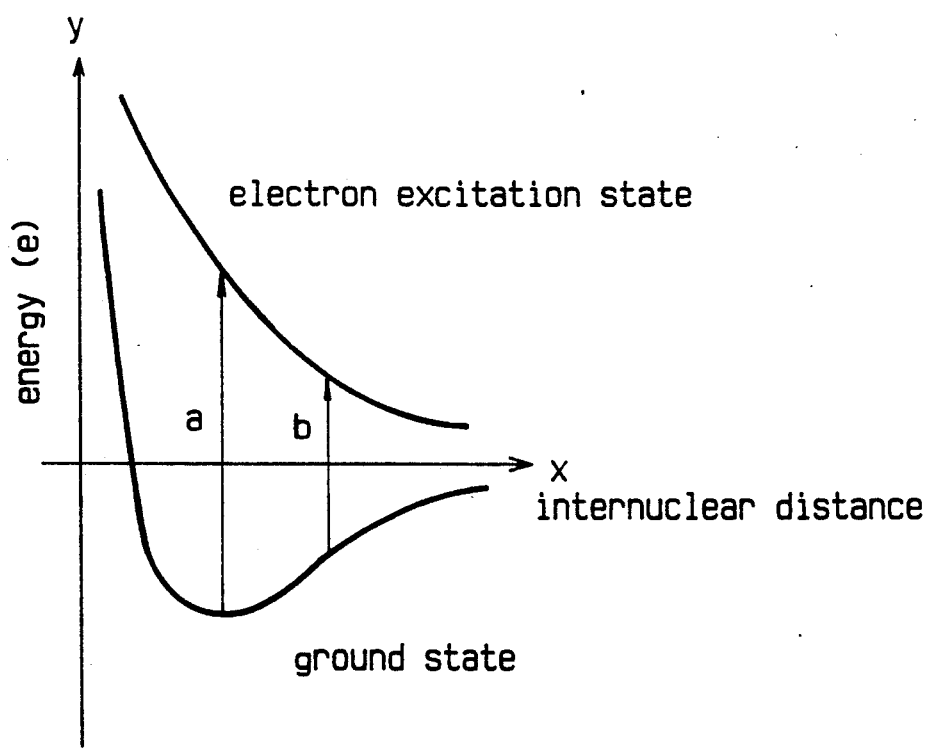
FIG. 3 is an schematic explanatory view of the principle of this invention and it illustrates conceptually the interrelation between the internuclear distance of a raw material gas molecule (x) and the irradiation energy (e).
Figure 4:
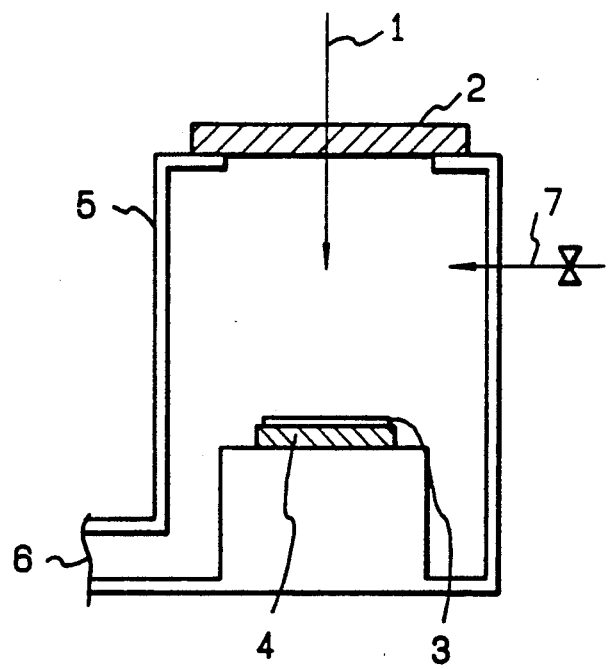
FIG. 4 shows schematically a conventional photochemical vapor deposition apparatus.

There are shown a typical embodiment and another embodiment of the photo-CVD apparatus according to this invention in FIG. 1 and FIG. 2 respectively, in which the same structural members as those members in the conventional photo-CVD apparatus shown in FIG. 4 are identified by the numerals used in the conventional photo-CVD apparatus.

The photo-CVD apparatus according to this invention shown in FIG. 1 such that the infrared ray transmissive window 9 is provided with the circumferential wall of the reaction chamber 5 so as to constitute a part of the circumferential wall and to substantially enclose the reaction space from the open air. The infrared ray transmissive window 9 comprises an infrared ray transmissive plate. It is so situated with the circumferential wall of the reaction chamber 5 that infrared rays 8 supplied through a waveguide from an infrared ray generating source (not shown) are allowed to enter through that window into the reaction space. They progress horizontally toward the opposite infrared ray transmissive window 9 taking infrared ray irradiation path 10 in a region of the reaction space near but above the substrate 3 while contacting a raw material gas. They leave through the opposite infrared ray transmissive window. In any case, the position of the infrared ray transmissive window 9 on the circumferential wall of the reaction chamber 5 is desired to be so designed that infrared rays progress horizontally in a space region of the reaction space near but above the substrate 3 and parallel thereto.

In the case of the photo-CVD apparatus according to this invention shown in FIG. 1, in the infrared ray path 10, a film forming raw material gas is irradiated simultaneously with infrared rays and high energy light from the foregoing high light energy generating source. Accordingly, the film forming raw material gas is very effectively decomposed which promotes the film deposition rate of a deposited film on the substrate. On the other hand, because the film forming raw material gas is mostly consumed in the formation of the deposited film, there is only slight occasion for the inner face of the light transmissive window 2 to be deposited with foreign matter resulting from the raw material gas.

The photo-CVD apparatus according to this invention shown in FIG. 2 is a modification of the photo-CVD apparatus shown in FIG. 1 in that a infrared ray generating circular source 11 is installed at a proper position in the reaction space of the reaction chamber so that irradiation of light energy supplied through the light transmissive window 2 into the reaction space is not hindered and the light energy is allowed to progress effectively toward the surface of the substrate. With the infrared ray generating source 11, there is provided a semicircular reflecting mirror 12 in such a way that infrared rays generated from the source 11 are all made to progress toward the surface of the substrate 3 symmetrically as pictured in FIG. 2. As an alternative to this case, it is possible for the infrared ray generating source 11 and the semicircular reflecting mirror to be so arranged that infrared rays generated from the source 11 are made to progress horizontally and in parallel to the substrate 3.

As the film forming raw material gas usable for the formation of a functional deposited film using the photo-CVD apparatus of this invention, any of the known film forming raw materials usable in either the known glow discharge processes or the known photo-CVD methods may be used as long as they are it is in the gaseous state at room temperature or can be easily made to be the gaseous state. One or more kinds of such raw materials may be used depending upon the kind of a functional deposited film to be formed. For instance, in the case of forming an A-Si deposited film, there may be used one or more kinds selected from silanes and halogen substituted silanes.

It is possible for such film forming raw material gas to be firstly diluted with $H_2$ gas, $F_2$ gas or an inert gas such as He gas or Ar gas then introduced into the reaction chamber.

In the preparation of the foregoing A-Si deposited film using the photo-CVD apparatus of this invention, it is possible to use a proper p-type or n-type dopant imparting raw material gas in order to obtain an A-Si deposited film doped with either a p-type dopant or an n-type dopant. In this case, such p-type or n-type dopant imparting raw material is introduced into the reaction chamber either alone or together with a film forming raw material gas or a proper carrier gas such as $H_2$ gas, He gas and Ne gas.

As the irradiation light energy source, there can be used, for example, a mercury-vapor lamp, a xenon arc lamp, a carbon oxide gas laser, an argon laser, a nitrogen gas laser, an excimer laser, etc.

In a preferred embodiment the irradiation light energy to be employed, has a wave length incapable of dissociating a raw material gas. In this case, it is possible to effectively prevent the inner face of the light transmissive window from being contaminated with deposition of the foreign matter resulting from the raw material gas. For example in this aspect, in the case of using disilane gas as the film forming raw material gas, since the disilane gas is not dissociated with irradiation light having a wavelength of longer than 200 nm, light having such wavelength is used.

Substrate 3 may be electroconductive or electrically insulating. The shape of the substrate may be optionally determined. Examples are drum, belt, plate and suitable like shapes.

It is not necessary to be heat the substrate to a predetermined temperature prior to commencement of the film formation. The temperature of the substrate during the film formation is properly determined depending upon the kind of a film forming raw material gas to be used and also depending upon other related film forming conditions. However, in general, it is between 30° C. and 450° C.

The reaction space of the reaction chamber 5 is not necessarily in a heated atmospheric condition, but, depending upon the kind of a film forming raw material gas used, it is possible to heat the reaction space atmosphere.

The formation of a functional deposited film using the photo-CVD apparatus of this invention is desired to be carried out under a reduced pressure condition. However, it is possible to be carried out under atmospheric conditions or increased pressure conditions.

In the case where it is carried out under a reduced pres sure condition, the air in the reaction space of the reaction chamber 5 is first evacuated to bring the reaction space to a vacuum of less than $5 \times 10^{-6}$ Torr or preferably, less than $1 \times 10^{-6}$ Torr prior to entrance of a film forming raw material gas. The reaction space is adjusted to a vacuum of preferably $1 \times 10^{-2}$ to $1 \times 10^2$ Torr or more preferably $1 \times 10^{-2}$ to 1 Torr after the film forming raw material gas is introduced.

What we claim is:

1. A process for forming a functional silicon containing deposited film on a substrate by a photochemical reaction which comprises the steps of:
   (a) introducing a silane or a halogen-substituted silane raw material gas into a reaction space of a reaction chamber containing said substrate on which said silicon containing deposited film is to be formed, said substrate being positioned on a substrate holder;
   (b) supplying infrared radiation, having a wavelength capable of vibrationally exciting and silane or halogen-substituted silane raw material gas;
   (c) simultaneously with step (b) supplying light energy having a wavelength more than 200 nm which is different from said infrared radiation, through a light transmissive window of said reaction chamber into said reaction space such that said vibrationally excited raw material gas is irradiated with said light energy to decompose or polymerize said vibrationally excited raw material gas, whereby said functional silicon containing deposited film is formed on said substrate at a high deposition rate without said light transmissive window being deposited with a film and wherein said light energy being (i) incapable of decomposing or polymerizing said silane or halogen-substituted silane raw material gas absent said vibrational excitation and (ii) capable of decomposing or polymerizing said silane or halogen-substituted silane raw material gas while vibrationally excited.

2. The process according to claim 1 including maintaining the reaction space at a vacuum of 0.01 to 10 Torr in the step (b).

3. The process according to claim 1 including employing as a source for said light energy a mercury vapor lamp, a xenon arc lamp, a carbon oxide gas laser, an argon laser, a nitrogen gas laser or an excimer laser.

4. The process according to claim 3 including maintaining the reaction space at a vacuum from 0.01 to 10 Torr in step (b).

* * * * *

UNITED STATES PATENT AND TRADEMARK OFFICE
CERTIFICATE OF CORRECTION

PATENT NO. : 5,112,647
DATED : May 12, 1992
INVENTOR(S) : AKIHARU TAKABAYASHI

It is certified that error appears in the above-identified patent and that said Letters Patent is hereby corrected as shown below:

IN [57] ABSTRACT

Line 4, "as" should read --gas--.
Line 7, "radiant" should be deleted.
Line 8, "a light" should read --a radiant light--.

COLUMN 1

Line 29, "act" should read --act such that--.

COLUMN 2

Line 63, "matters" should read --matter--.

COLUMN 4

Line 1, "being pro-" should be deleted.
Line 2, "vided" should be deleted.

COLUMN 6

Line 2, "wave length" should read --wavelength--.
Line 35, "pres sure" should read --pressure--.

UNITED STATES PATENT AND TRADEMARK OFFICE
CERTIFICATE OF CORRECTION

PATENT NO. : 5,112,647
DATED      : May 12, 1992
INVENTOR(S): AKIHARU TAKABAYASHI

It is certified that error appears in the above-identified patent and that said Letters Patent is hereby corrected as shown below:

COLUMN 6

Line 55, "gas;" should read --gas into said reaction space to irradiate said silane or halogen-substituted silane raw material gas in a region of the reaction chamber above said substrate to permit said silane or halogen-substituted silane raw material gas to become vibrationally excited; and--.

Signed and Sealed this

Seventh Day of September, 1993

Attest:

BRUCE LEHMAN

Attesting Officer        Commissioner of Patents and Trademarks